US009196983B2

(12) United States Patent
Saur et al.

(10) Patent No.: US 9,196,983 B2

(45) Date of Patent: Nov. 24, 2015

(54) PLUG CONNECTOR FOR DIRECT CONTACTING ON A CIRCUIT BOARD

(75) Inventors: Martin Saur, Salach (DE); Markus Lux, Winnenden (DE); Eckhardt Philipp, Schwieberdingen (DE); Achim Puettner, Aalen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 124 days.

(21) Appl. No.: 14/110,200

(22) PCT Filed: Feb. 29, 2012

(86) PCT No.: PCT/EP2012/053438

§ 371 (c)(1), (2), (4) Date: Dec. 11, 2013

(87) PCT Pub. No.: WO2012/136416

PCT Pub. Date: Oct. 11, 2012

(65) Prior Publication Data

US 2014/0087572 A1 Mar. 27, 2014

(30) Foreign Application Priority Data

Apr. 6, 2011 (DE) ......................... 10 2011 006 867

(51) Int. Cl.

| | |
|---|---|
| ***H01R 12/00*** | (2006.01) |
| ***H05K 1/00*** | (2006.01) |
| ***H01R 12/71*** | (2011.01) |

(Continued)

(52) U.S. Cl.

CPC ............ *H01R 12/714* (2013.01); *H01R 12/515* (2013.01); *H01R 13/2428* (2013.01); *H01R 13/24* (2013.01); *H01R 13/5219* (2013.01)

(58) Field of Classification Search

CPC .... H01R 12/714; H01R 12/515; H01R 12/71; H01R 13/2428; H01R 13/5219; H01R 13/24

USPC ................................................ 439/81, 79, 66

See application file for complete search history.

(56) References Cited

U.S. PATENT DOCUMENTS

| | | | |
|---|---|---|---|
| 6,264,476 | B1 | 7/2001 | Li et al. |
| 6,966,781 | B1 | 11/2005 | Bullinger et al. |

(Continued)

FOREIGN PATENT DOCUMENTS

| | | |
|---|---|---|
| DE | 29610996 | 9/1996 |
| EP | 1852943 | 11/2007 |

(Continued)

OTHER PUBLICATIONS

Machine Translation of JP 11 121112, Jan. 30, 2015.*

(Continued)

*Primary Examiner* — Javaid Nasri

(74) *Attorney, Agent, or Firm* — Kenyon & Kenyon LLP

(57) ABSTRACT

A plug connector for direct electrical contacting of contact surfaces on a circuit board includes at least one electrical end contact of an electric line inserted into the plug connector housing in a plug-in direction and at least one separate electrical contact element, which protrudes elastically beyond one housing side of the plug connector housing transversely to the end contact for electrical contacting of a contact surface of the circuit board and is in electrically conductive contact with the end contact, at least when the contact surface has been contacted.

16 Claims, 9 Drawing Sheets

(51) Int. Cl.
*H01R 12/51* (2011.01)
*H01R 13/24* (2006.01)
*H01R 13/52* (2006.01)

(56) References Cited

U.S. PATENT DOCUMENTS

| | | | | |
|---|---|---|---|---|
| 2007/0270009 | A1 | 11/2007 | Schneider Nee Hild et al. | |
| 2009/0258515 | A1 * | 10/2009 | Masuda | 439/81 |
| 2011/0070762 | A1 | 3/2011 | Hiramatsu | |

FOREIGN PATENT DOCUMENTS

| | | | |
|---|---|---|---|
| JP | 05013115 | | 1/1993 |
| JP | 11 121112 | * | 4/1999 |
| JP | 2001217025 | | 8/2001 |
| JP | 2003045541 | | 2/2003 |
| JP | 2005302573 | | 10/2005 |
| JP | 2010262854 | | 11/2010 |
| JP | 2011003355 | | 1/2011 |
| WO | WO2007/038973 | | 4/2007 |

OTHER PUBLICATIONS

International Search Report for PCT/EP2012/053438, issued on Aug. 6, 2012.

* cited by examiner

PLUG CONNECTOR FOR DIRECT CONTACTING ON A CIRCUIT BOARD

FIELD OF THE INVENTION

The present invention is directed to a plug connector.

BACKGROUND INFORMATION

In the automotive field, engine control units are presently available in various mechanical designs. The design of so-called extrusion-coated engine control units having a contacting area for direct contacting is a recent development in this field. Direct contacting of the circuit board and wiring harness eliminates the male multipoint connector which is usually used. The costs of manufacturing an engine control unit may be reduced in this way. Extrusion-coating of the assembled circuit board eliminates several manufacturing steps, again permitting cost savings. During extrusion-coating, the assembled circuit board is extrusion-coated directly with a plastic (preferably a thermosetting plastic), thereby eliminating the otherwise customary top and bottom components. The result is a compact, comparatively small engine control unit, which is well protected from environmental influences. However, this simple and compact overall design of an extrusion-coated engine control unit complicates the contacting of the circuit board by the plug connector of the opposite side and a secure fixation of the configuration of the engine control unit and the plug connection in the automobile. Due to the general requirement of minimizing the overall installation space, it is desirable to supply the electrical contacts of the plug connector, which are mechanically and electrically connected to the individual electric lines, to the contact surfaces in parallel with the circuit board. The need to individually seal the mounted contacts on their corresponding lines and the associated need to be able to mount the contacts in the sealed interior area of the plug through this opening in the seal prohibits a large or filigree or sharp-edged design of precisely these contacts.

SUMMARY

An object of the present invention is to achieve the following requirements with a generic plug connector:

- a mechanically gentle contacting of the current-carrying contact elements of the plug connector on the contact surface of the circuit board;
- a secure, i.e., mechanically resilient fixation and electrical contacting of the cable sections of the current-carrying contact elements inserted into the plug connector;
- a secure seal on the circuit board to protect the contacting area from harmful environmental influences; and
- a compact design of the overall configuration of the circuit board and the plug connector.

In a first variant, it is proposed according to the present invention that the electrical connection between the electric line (on the wiring harness side) and the contact surface (on the circuit board side) be established with the aid of a contact spring bent up in an S-shape. In addition, it is proposed that the two contact spring legs be designed to have different degrees of flexural rigidity and to ensure with the aid of a premounted slide that these contact forces, which are optimal to different extents for contacting the two areas, may be separated from one another and applied in a targeted manner. The contact spring bent up in an S-shape is preferably premounted in the slide, where it awaits the electric line, which is provided with a round contact, for example (e.g., a wire-end ferrule), which is inserted laterally between a housing rear wall and the flexurally rigid spring leg. The free leg end of the flexurally rigid spring leg is able to lock the inserted round contact with respect to the rear wall of the housing behind a peripheral groove of the inserted round contact which is provided for this purpose. Since the contact springs are not yet prestressed at this point in time, the round contacts may be brought into the locking positions with low assembly forces. When all the contacts are mounted and prelocked in this way, the slide is inserted into the plug housing. Since the center section of the bent up spring is mounted in the slide, the flexurally rigid spring leg is then pressed against the corresponding round contact. Electrical contacting therefore comes about between the contact spring and the corresponding round contact and is characterized by high normal contact forces. The flexurally soft spring leg is not yet deformed by the displacement of the connecting link. It continues to protrude outward on the underside of the connecting link without being under load and is ready for contacting on the corresponding contact surface. If the plug connector is placed on the contact surfaces of the extrusion-coated control unit, then much lower forces may act on the contact surfaces at the point of contact, as desired, than on the side of the electric line. A face seal which protects the contacting area from the surroundings by sealing it on the surface of the extrusion-coated control unit is preferably situated around the slide and thus around the contact elements.

The advantage of this variant according to the present invention lies both in the secure, i.e., mechanically resilient, fixation and electrical contacting of the cable sections of the current-carrying contact elements inserted into the plug connection and in the mechanically gentle contacting of the current-carrying contact elements of the plug connector on the surface of the contact lands of the circuit board.

According to the present invention, it is proposed in a second variant that a flexurally elastic end contact, which is mechanically and electrically connected directly to the electric line, be combined with a rigid but movably supported contact adapter in such a way that the distance between the plane of the line and the surface of the circuit board is bridged. The flexurally elastic end contact resembles in its external shape a thin flat blade and may be connected to the electric line by a crimp connection or an integrally bonded connection. The flexurally elastic end contact across its longitudinal axis should be supported on the two outer ends of the flexurally elastic area. A deflection of this area between these two supports into the interior of the housing should be possible due to a corresponding recess in this section of the housing. The flexurally elastic flat blade is initially attached to the electric line and then pushed into the plug connector housing in parallel with the surface of the circuit board and locked in place there. In doing so, it is pushed behind the rigid contact adapter, which has already been premounted and is movably supported, whereby under some circumstances this piece is easily pushed out of its resting position and thus toward the expected contact partner (circuit board contact surface). If the entire configuration for contacting is placed on the contact surface, then the contact adapter and the contact surface are in contact. The movable contact adapter is pushed back into the housing and is then supported on the center section of the flexurally elastic end contact, which is deflected elastically toward the rear at the center, whereby the normal contact force required for permanent secure contacting is applied.

The contact adapter should preferably be designed with a circular rolling contour of its contact surfaces. This would have the advantage that the contact adapter remains in permanent rolling mechanical contact with the contact land as well as with the flexurally elastic contact element, even with minor planar shifts in the circuit board with respect to the plug connector, the locked end contact (e.g., due to vibrations or thermally induced relative movements). Due to the rolling movement, the expected wear due to friction on the contact partners is greatly reduced in comparison with a relative sliding motion at the mechanical points of contact and thus at the electrically important contact points throughout the entire configuration.

The advantage of this variant according to the present invention lies in the secure bridging of the distance between the plane of the line (mounting plane of the contact) and the plane of the circuit board as well as in the possibility of simultaneously implementing a rolling contacting between the contact partners involved in this way.

DETAILED DESCRIPTION

Figure 1:
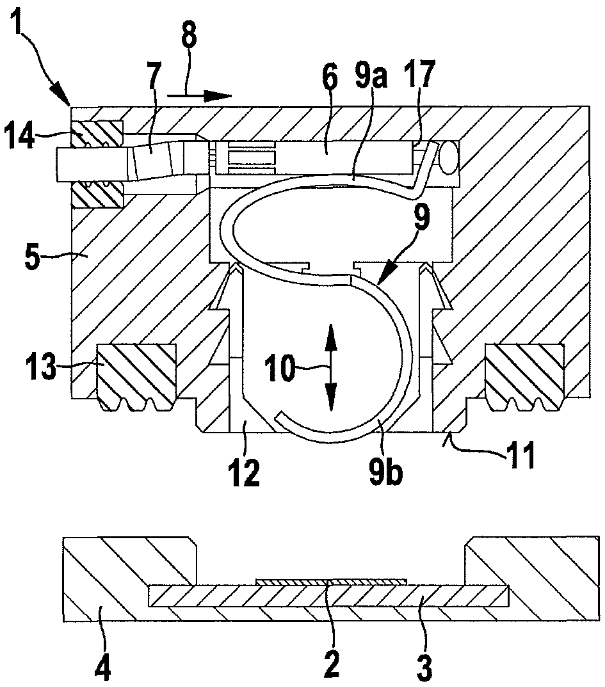
FIG. 1 shows a first exemplary embodiment of the plug connector according to the present invention in a longitudinal section.

Plug connector 1 shown in FIG. 1 provides direct electrical contacting of contact surfaces (“lands”) 2 on a circuit board 3 which is surrounded by extrusion-coated plastic 4 except for contact surfaces 2.

Plug connector 1 includes a plug connector housing 5, multiple electrical end contacts 6 of electric lines 7, situated side by side in a row, which are inserted into plug connector housing 5 in a plug-in direction 8 as well as multiple separate electrical contact elements in the form of S-shaped bent contact springs 9 situated side by side in a row. The longitudinal section in FIG. 1 shows only end contact 6 at the front of its row and contact spring 9 at the front of its row.

S-shaped bent contact spring 9 rests on end contact 6 with its one bent spring leg 9*a* and, for contacting contact surface 2, protrudes elastically with its other bent spring leg 9*b* transversely to end contact 6 (double arrow 10) beyond housing side 11 of plug connector housing 5 facing contact surface 2. Inserted end contact 6 may be designed as a round contact (e.g., a wire-end ferrule) and may be locked against plug-in direction 8 to spring leg 9*a* contacting it. Spring leg 9*b* protruding beyond housing side 11 is accommodated in a slide 12, which is displaceable in a transverse direction 10 in plug connector housing 5. In addition, a face seal 13, which surrounds protruding spring leg 9*b* together with slide 12 all the way around and thereby seals it with respect to plug connector housing 5 is also provided on housing side 11. Line 7 is sealed with respect to plug connector housing 5 by a line seal 14.

Figure 2:
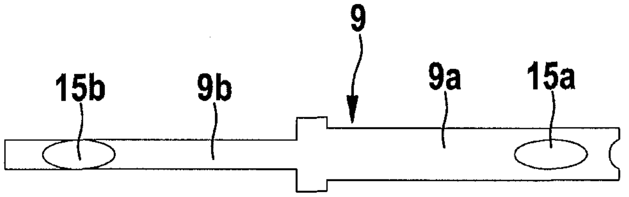
FIG. 2 shows the developed view of a contact spring shown in FIG. 1.

As shown in FIG. 2, spring leg 9*a* of contact spring 9, which is in contact with end contact 6, is designed to be wider and thus to have greater flexural rigidity than spring leg 9*b* protruding beyond housing side 11. Contact spring 9 also has contact tips 15*a*, 15*b* for contacting end contact 6 and contact surface 2.

With reference to FIG. 3, the assembly of plug connector 1 with end contact 6, the prestressing of contact spring 9 and the direct contacting on circuit board 3 are described below.

Figure 3A:
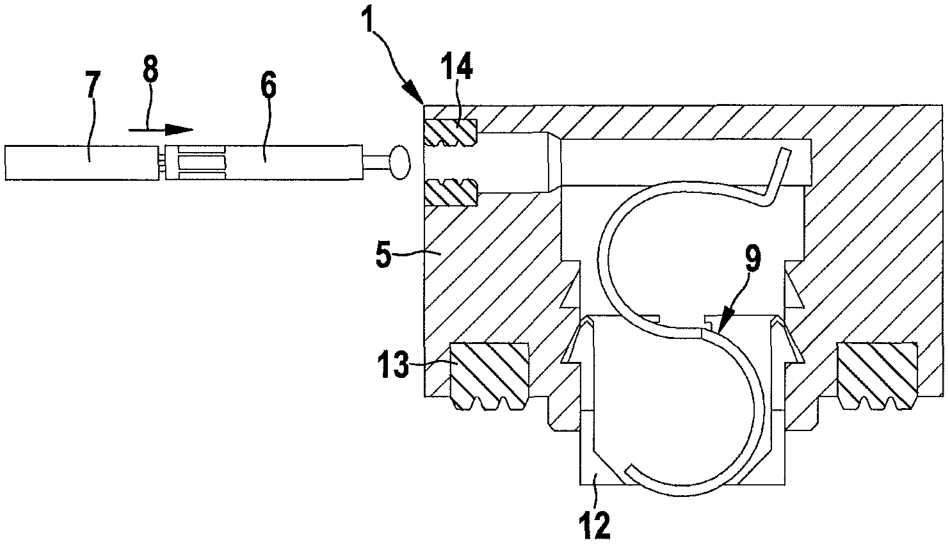
FIGS. 3*a* through 3*h* show the assembly and the direct contacting of the plug connector shown in FIG. 1.

FIG. 3*a* shows plug connector 1, which is not yet assembled with an end contact 6, slide 12 being in a prelocked position. S-shaped bent contact spring 9 is premounted in slide 12 and engages laterally with its flexurally rigid spring leg 9*a* in the plug path of end contact 6 to be inserted.

Figure 3B:
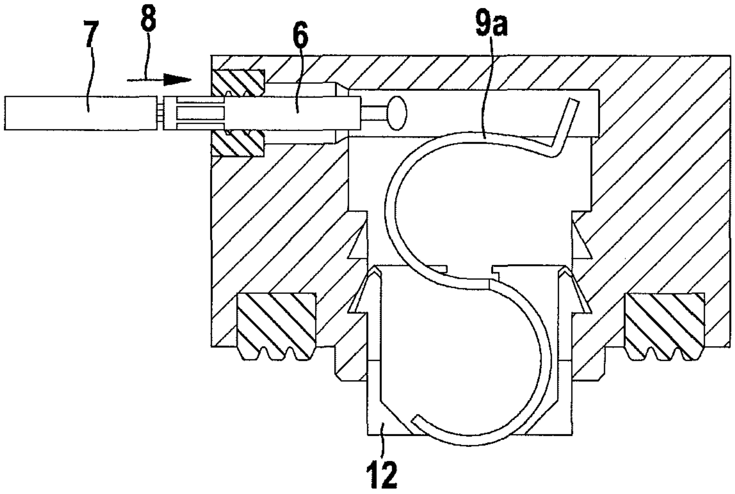
Figure 3C:
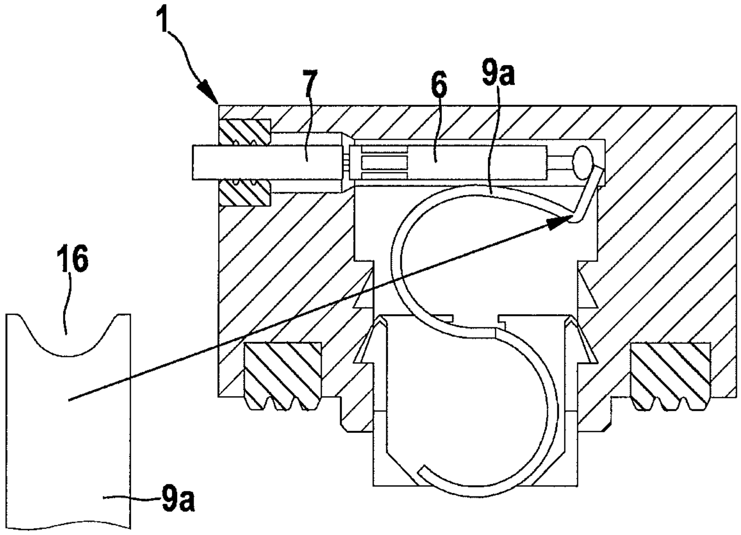
Figure 3D:
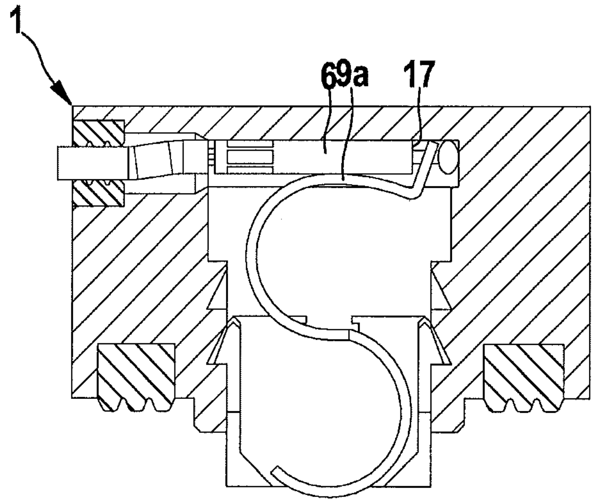
Figure 3E:
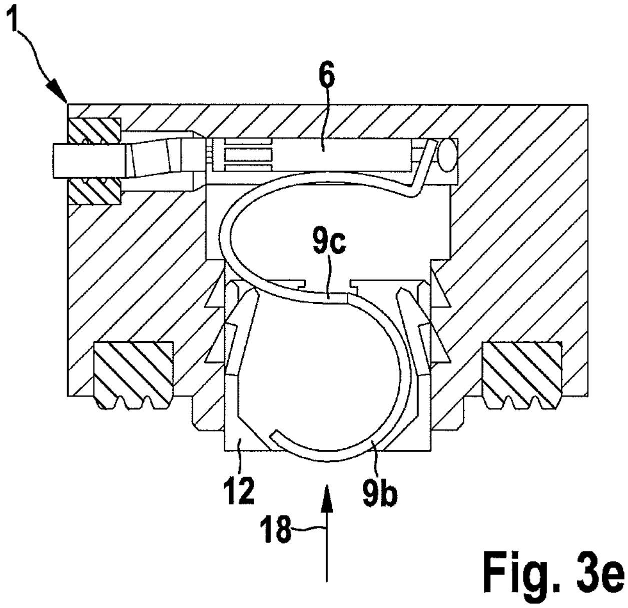

As shown in FIG. 3*b*, end contact 6 is inserted in plug-in direction 8 through line seal 14 into plug connector housing 5, more specifically between the rear wall of the housing and flexurally rigid spring leg 9*a*. In this way, flexurally rigid spring leg 9*a* is deflected out of the plug-in path (FIG. 3*c*) by end contact 6 until it locks with a catch recess 16 provided at the end in a ring groove (“locking groove”) 17 of end contact 6, thereby securing end contact 6 to prevent it from being pulled out of plug connector housing 5 (FIG. 3*d*).

Figure 3F:
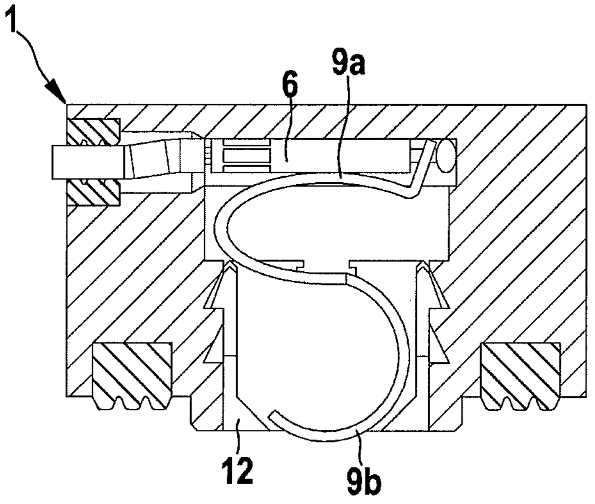
Figure 3G:
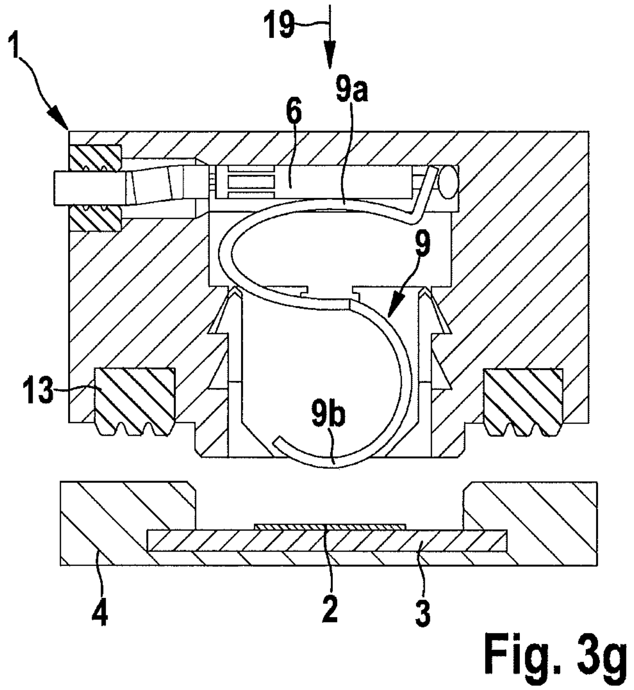
Figure 3H:
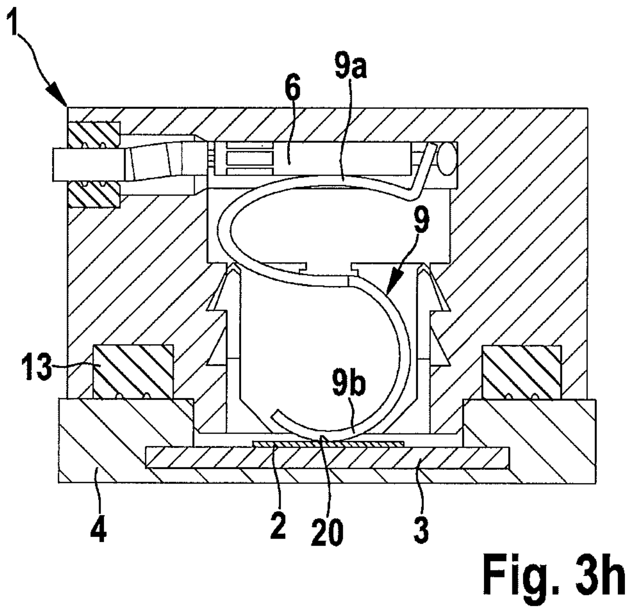

Since contact springs 9 are not yet prestressed at this point in time, end contacts 6 may be brought into locking positions with low assembly forces. If all end contacts 6 in a row are mounted and prelocked in this way, slide 12 is inserted into plug connector housing 5 (FIG. 3*e*) in direction 18 of the arrow and locked there. Since middle spring section 9*c* of contact spring 9, which is situated between two spring legs 9*a*, 9*b* is secured in slide 12, flexurally rigid spring leg 9*a* is now pressed with its contact tip 15*a* against end contact 6 (FIG. 3*f*). This brings about an electrical contacting between contact spring 9 and end contact 6, which is characterized by high normal contact forces. Flexurally soft spring leg 9*b* is not deformed by the displacement of slide 12 and continues to protrude out of slide 12 and beyond housing side 11 without any load. If plug connector 1 is placed on contact surface 2 of circuit board 3 in direction 19 of the arrow (FIGS. 3*g*, 3*h*), then definitely lower forces may act on direct contact point 20 on contact surface 2 on this spring leg 9*b*, as desired, than on the other spring leg 9*a*. Since the optimal contact forces, which are different for contacting two spring legs 9*a*, 9*b*, are applied separately from one another and in a targeted manner a secure, i.e., mechanically resilient fixation and electrical contacting of end contacts 6 and/or electric lines 7 inserted into plug connector 1, on the one hand, and mechanically protective contacting of contact surfaces 2 by contact springs 9 of plug connector 1, on the other hand, are made possible. Face seal 13 rests on extrusion-coated plastic 4, thereby sealing plug connector 1 with respect to circuit board 2.

Figure 4:
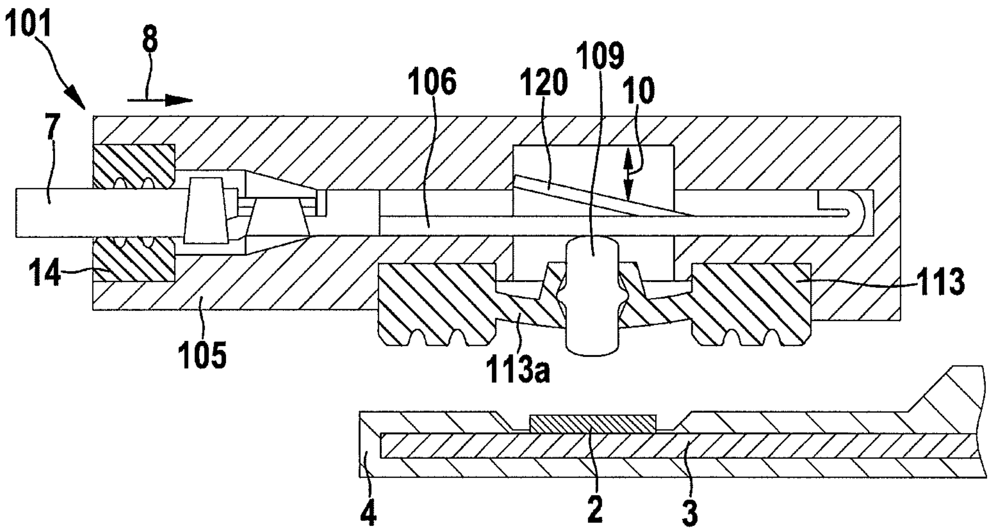
FIG. 4 shows a second exemplary embodiment of the plug connector according to the present invention in a longitudinal section.

FIG. 4 shows a different plug connector 101, in which end contacts 106 are each designed as a flexurally elastic flat blade in transverse direction 10, and electrical contact elements 109 are each designed as a rigid contact adapter mounted in a transversely movable manner. The longitudinal sectional view in FIG. 4 shows only end contact 106, which is at the front of its row, and contact adapter 109, which is at the front of its row. Flexurally elastic end contact 106 inserted in plug-in direction 8 is primarily locked by a primary lance 120 facing outward in plug connector housing 105. Contact adapter 109 is accommodated in a sealing center section 113*a*, which is flexible in transverse direction 10, of face seal 113 surrounding contact adapter 109, which is thereby supported in a transversely movable manner. End contact 106 may be connected to electric line 7 by a crimp connection or an integrally bonded connection.

Figure 5A:
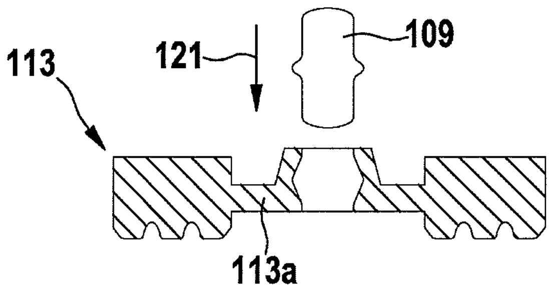
FIGS. 5*a*, 5*b* show a face seal, which is illustrated in FIG. 4, in a longitudinal section (FIG. 5*a*) and in a top view (FIG. 5*b*).
Figure 5B:
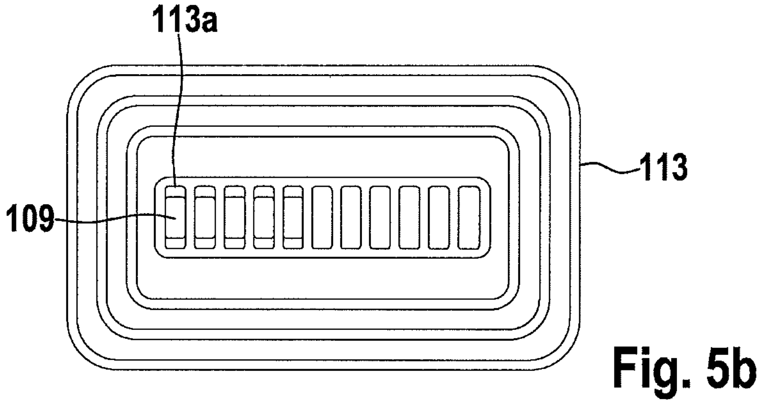

As shown in FIG. 5*a*, contact adapter 109 is inserted into a corresponding opening of sealing center section 113*a* in direction 121 of the arrow. FIG. 5*b* shows the top view of face seal 113, which is partially assembled with contact adapters 109.

With respect to FIG. 6, the assembly of plug connector 101 with flexurally elastic flat blade 106 and the direct contacting on circuit board 3 are described below.

Figure 6A:
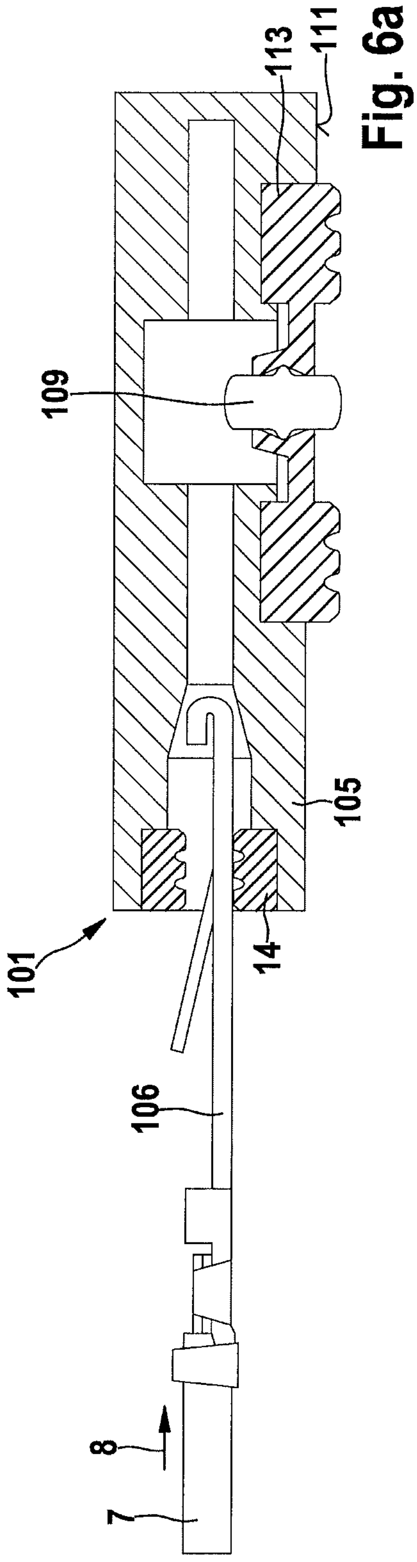
FIGS. 6*a* through 6*d* show the assembly and the direct contacting of the plug connector shown in FIG. 4.

FIG. 6*a* shows plug connector 101 with flexurally elastic flat blade 106 already inserted through line seal 14 but not yet advanced past contact adapter 109. Contact adapter 109 may protrude laterally into the plug-in path of flat blade 106 to be plugged in, so that with further insertion, contact adapter 109 is deflected outward by flat blade 106 and comes to rest against it.

Figure 6B:
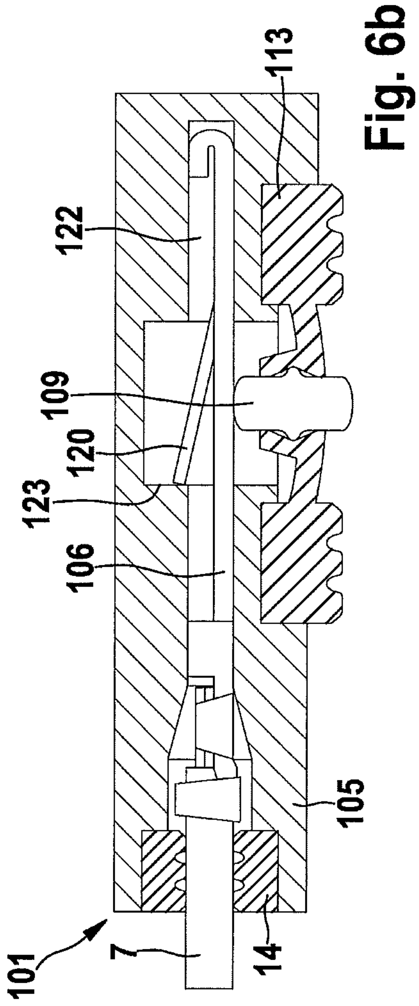
Figure 6C:
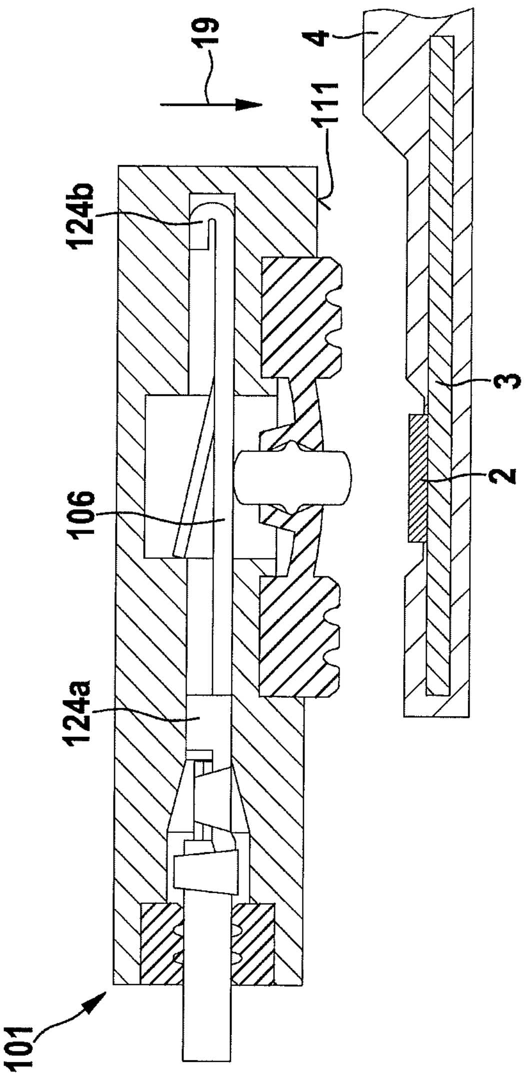
Figure 6D:
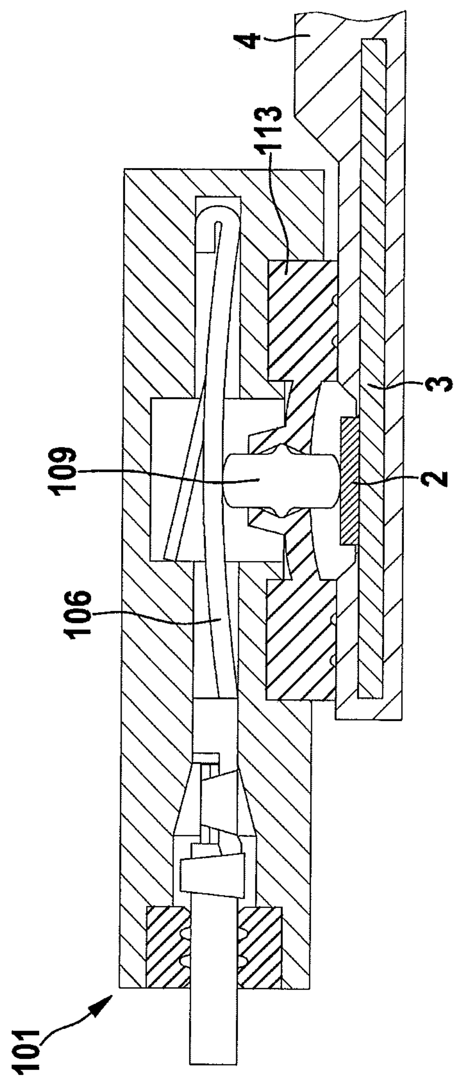

In its end position shown in FIG. 6*b*, flexurally elastic flat blade 106 engages with its front blade end in a corresponding recess 122 in plug connector housing 105 and is primarily locked in plug connector housing 105 via primary lance 120, engaging behind an undercut 123 in plug connector housing 105 in plug-in direction 8.

If plug connector 101 is placed in direction 19 of the arrow on contact surface 2 of circuit board 3 (FIGS. 6*c*, 6*d*), contact adapter 109 protruding beyond housing side 111 and beyond face seal 113 is pushed back into plug connector housing 105 in transverse direction 10 and is then supported on the center section of flexurally elastic flat blade 106. The latter is deflected elastically toward the rear at the center, whereby the normal contact force of contact adapter 108 on contact surface 2, required for permanent secure contacting, is applied. Flexurally elastic flat blade 106 is supported across its longitudinal axis on its two outer blade ends on the housing side at 124*a*, 124*b*. Deflection of flexurally elastic flat blade 106 between these two supports 124*a*, 124*b* into the interior of plug connector housing 105 is possible through an appropriate housing recess. Face seal 113 rests on extrusion-coated plastic 4, thereby sealing plug connector 101 with respect to circuit board 2.

Figures 7A, 7B:
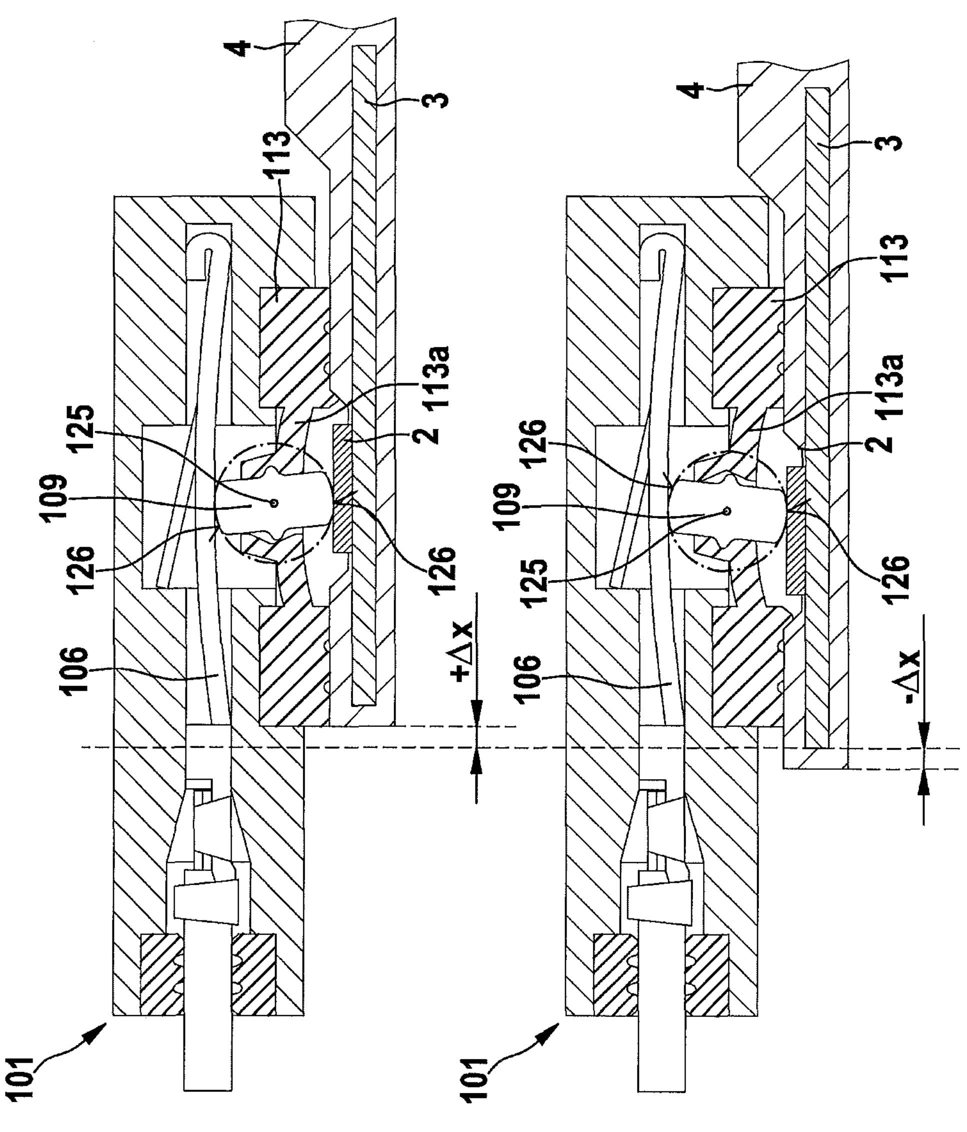
FIGS. 7*a*, 7*b* show the contact situation with relative shifts between the plug connector shown in FIG. 4 and a directly contacted circuit board.

As shown in FIGS. 7*a*, 7*b*, contact adapter 109 in sealing center section 113*a* of face seal 113 is also supported pivotably about an axis 125 running in parallel to the direction of the row of flat blades 106 and contact adapters 109 and is thus in contact with flat blade 106 and contact surface 2 with a rolling contour 126 which is circular about axis 125. With minor shifts in circuit board 2 with respect to plug connector 101 in a direction +Δx (FIG. 7*a*) or in another direction −Δx (FIG. 7*b*), e.g., as a result of vibrations or thermally induced relative movements, contact adapter 109 may roll on flat blade 106 and on contact surface 2 and thus remain in mechanical contact and therefore in electrically conducting contact with flat blade 106 and with contact surface 2. Due to the rolling motion, the wear due to friction, which is to be expected at the points of mechanical contact and thus also at the electrically important contact points of the overall configuration, is greatly reduced in comparison with a relative sliding movement of the contact partners.

What is claimed is:

1. A plug connector for a direct electrical contacting of a contact surface on a circuit board, comprising:

a plug connector housing;

at least one electrical end contact of an electric line inserted into the plug connector housing in a plug-in direction; and at least one separate electrical contact element that protrudes elastically beyond a housing side of the plug connector housing and in a direction perpendicular to the plug-in direction for electrical contacting of the contact surface of the circuit board, the protruding contact element being electrically conductively in contact with the end contact at least with the contacted contact surface.

2. The plug connector as recited in claim 1, further comprising:

a face seal surrounding the protruding contact element all around and provided on the housing side beyond which the protruding contact element protrudes.

3. The plug connector as recited in claim 1, wherein the protruding contact element is designed as an S-shaped bent contact spring having a first spring leg in contact with the end contact and a second spring leg protruding beyond the housing side.

4. The plug connector as recited in claim 3, wherein the first spring leg is flexurally more rigid than the second spring leg.

5. The plug connector as recited in claim 3, wherein the end contact is locked to the first spring leg located adjacently to the end contact.

6. The plug connector as recited in claim 3, further comprising:

a slide in which the second spring leg is accommodated, wherein the slide is displaceable transversely to the end contact.

7. The plug connector as recited in claim 6, wherein the contact spring is attached to the slide between the first and second spring legs.

8. The plug connector as recited in claim 3, wherein the end contact includes a round contact.

9. The plug connector as recited in claim 1, wherein the protruding contact element includes a rigid contact adapter mounted to be transversely movable.

10. The plug connector as recited in claim 9, further comprising:

a face seal, wherein the contact adapter is accommodated in a flexible center section of the face seal surrounding the contact adapter, the center section being flexible in a transverse direction.

11. The plug connector as recited in claim 10, wherein the contact adapter is mounted pivotable about an axis and is in contact with the end contact and the contact surface with a rolling contour which is circular about the axis.

12. The plug connector as recited in claim 11, wherein the contact adapter is mounted in the center section of the face seal.

13. The plug connector as recited in claim 9, wherein the end contact is flexurally elastic in a transverse direction.

14. The plug connector as recited in claim 1, wherein the end contact is locked in the plug connector housing.

15. A plug connector for a direct electrical contacting of a contact surface on a circuit board, comprising:

a plug connector housing;

at least one electrical end contact of an electric line inserted into the plug connector housing in a plug-in direction; and at least one separate electrical contact element that electrically contacts the contact surface of the circuit board and the electrical end contact, the separate electrical contact element protruding elastically beyond a housing side of the plug connector housing, wherein the at least one separate electrical contact element is designed as an S-shaped bent contact spring having a first arced spring leg in contact with the end contact and a second arced spring leg protruding beyond the housing side, and wherein the second arced spring leg protrudes in a direction perpendicular to the plug-in direction.

16. A plug connector for a direct electrical contacting of a contact surface on a circuit board, comprising:

a plug connector housing;

at least one electrical end contact of an electric line inserted into the plug connector housing in a plug-in direction; and at least one separate electrical contact element that electrically contacts the contact surface of the circuit board and the electrical end contact, the separate electrical contact element protruding elastically beyond a housing side of the plug connector housing, wherein the separate electrical contact element protrudes from the housing side in a direction perpendicular to the plug in direction, and wherein the separate electrical contact element protrudes from the housing side from a face seal located one of above or below the electrical end contact.

* * * * *